(12) United States Patent
Hsu

(10) Patent No.: US 8,058,105 B2
(45) Date of Patent: Nov. 15, 2011

(54) METHOD OF FABRICATING A PACKAGING STRUCTURE

(75) Inventor: Shih-Ping Hsu, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 0 days.

(21) Appl. No.: 12/893,036

(22) Filed: Sep. 29, 2010

(65) Prior Publication Data

US 2011/0097850 A1   Apr. 28, 2011

(30) Foreign Application Priority Data

Oct. 22, 2009  (TW) .............................. 98135718 A

(51) Int. Cl.
*H01L 21/78* (2006.01)

(52) U.S. Cl. ........ 438/113; 438/108; 438/109; 438/110; 438/125; 438/126; 257/723; 257/778; 257/E23.169; 257/E23.173; 257/E21.506; 257/E21.511; 257/E21.523

(58) Field of Classification Search .................. 257/723, 257/778, E23.169, E23.173, E21.506, E21.511, 257/E21.523; 438/108, 109, 110, 113, 125, 438/126

See application file for complete search history.

(56) References Cited

U.S. PATENT DOCUMENTS

| | | | | |
|---|---|---|---|---|
| 6,607,940 B2 * | 8/2003 | Yasunaga | | 438/112 |
| 7,045,392 B2 * | 5/2006 | Hashimoto | | 438/110 |
| 2005/0133895 A1 * | 6/2005 | Ujiie et al. | | 257/678 |
| 2005/0167830 A1 * | 8/2005 | Chang et al. | | 257/737 |
| 2006/0192287 A1 * | 8/2006 | Ogawa et al. | | 257/758 |
| 2006/0223236 A1 * | 10/2006 | Nomura et al. | | 438/121 |
| 2008/0191326 A1 * | 8/2008 | Lin et al. | | 257/666 |

\* cited by examiner

*Primary Examiner* — Eugene Lee
*Assistant Examiner* — Peniel M Gumedzoe
(74) *Attorney, Agent, or Firm* — Peter F. Corless; Steven M. Jensen; Edwards Angell Palmer & Dodge LLP

(57) ABSTRACT

A method of fabricating a packaging structure includes cutting a panel of packaging substrate into a plurality of packaging substrate blocks each having a plurality of packaging substrate units; mounting and packaging a semiconductor chip on each of the packaging substrate unit to form package blocks each having multiple packaging structure units; and cutting package blocks to form a plurality of package units. In the method, the alignment difference between the packaging structure units in each package block is minimized by appropriately cutting and forming substrate blocks to achieve higher precision and better yield, and also packaging of semiconductor chips can be performed on all package units in the substrate blocks, thereby integrating fabrication with packaging at one time to improve production efficiency and reduce the overall costs as a result.

7 Claims, 5 Drawing Sheets

US 8,058,105 B2

METHOD OF FABRICATING A PACKAGING STRUCTURE

CROSS-REFERENCES TO RELATED APPLICATIONS

This application claims under 35 U.S.C. §119(a) the benefit of Taiwanese Application No. 098135718 filed Oct. 22, 2009, the entire contents of which is incorporated herein by reference.

BACKGROUND OF THE INVENTION

1. Field of the Invention

This invention relates to methods of fabricating a packaging structure, and more particularly, to a method of fabricating a packaging structure that may increase yield and reduce cost.

2. Description of Related Art

In order to meet the packaging requirements of high integration and miniaturization for semiconductor packages, and to provide a packaging substrate that allows a plurality of active and passive element to be installed thereon, a multiple-layered board is replacing a single-layered board gradually. Therefore, a layout area may be increased through the use of an interlayer connection technique, and the requirement of highly integrated circuit may be formed on the multiple-layered board.

A multiple-layered circuit board of the prior art comprises a core board and two built-up structures symmetrically installed on two surfaces of the core board. The use of the core board causes the circuit board to have a long conductive wire and thicker structure, which is contradictory to the requirements of increasing performance and reducing sizes. A circuit board that has a coreless structure comes to the market, in order to satisfy the demands of shorten conductive length and reduced structure thickness.

In the modern flip chip semiconductor packaging technique, a semiconductor chip having an active surface is installed on a packaging substrate having a plurality of conductive lands on a top surface thereof, and a plurality of electrode pads are installed on the active surface and are electrically connected via solder bumps to the conductive-lands, allowing the semiconductor chip to be electrically connected to the packaging substrate.

Compared with a conventional wire bond technique, the flip chip technique is characterized in that the electrical connection between the semiconductor chip and the packaging substrate is realized by the solder bumps, rather than by a common gold wire. The flip chip technique has advantages of high packaging density and small packaging size. Without using the longer gold wire, the flip chip technique may reduce the resistance and improve the electric functionalities.

A method of fabricating a packaging structure according to the prior art provides a panel of substrate body that has a front-end fabricating process completed and includes a multiple-layered circuit connection structure, an outermost circuit of the panel of substrate body having a plurality of bump pads; forms on the substrate body an insulating protection layer having a plurality of openings formed therein, allowing the bump pads to be exposed from the openings; forms a surface treatment layer on the bump pads in the openings, so as to form a panel of packaging substrate (panel); cuts the panel of packaging substrate into a plurality of packaging substrate units or a plurality of packaging substrate strips, each of the packaging substrate strips having a plurality of packaging substrate units; and, transfers the packaging substrate strips to a packaging factory for subsequent chip attachment, packaging and/or singulation processes.

However, if the chip attachment and packaging processes are performed after the panel of packaging substrate is cut into the packaging substrate units, only one of the packaging substrate units is processed at one time, which reduces the yield and increases the cost. Moreover, if the chip attachment, packaging and singulation processes are performed after the panel of packaging substrate is cut into the packaging substrate strips, each of the packaging substrate strips has to have a rim reserved for the packaging substrate strip to be clamped during the subsequent processes. The rim occupies too much the area and wastes the material cost.

With the packaging substrate becoming thinner and thinner, it is more and more difficult to perform the chip attachment or packaging process on the packaging substrate units or packaging substrate strips.

If the chip attachment, packaging and singulation processed are performed on the panel of substrate, without cutting the panel of packaging substrate into a plurality of packaging substrate units or a plurality of packaging substrate strips in advance, a larger semiconductor equipment is required. Accordingly, the equipment cost is increased. Besides, the larger the area of the panel of packaging substrate is, the lower the precision becomes. Therefore, the final packaging structure units have a larger fabricating error, which affects the yield.

Therefore, how to solve the problems of the method of fabricating a packaging structure of the prior art that the fabricating steps are complicated, yield is low, too many effective area of the substrate is wasted and the cost is high is becoming one of the most popular issues in the art.

SUMMARY OF THE INVENTION

In view of the above-mentioned problems of the prior art, present invention provides a method of fabricating a packaging structure, including: providing a panel of up-down paired packaging substrate, wherein two insulating protection layers having a plurality of openings are formed on two opposing outermost surfaces of the packaging substrate, respectively, and each of the openings has a metal bump installed therein; cutting the packaging substrate into a plurality of up-down paired packaging substrate blocks, each of the packaging substrate blocks having M×N up-down paired packaging substrate units arranged in an array, wherein the metal bumps are formed on the packaging substrate units, and both M and N are an integer greater than one; installing a semiconductor chip on the metal bumps of each of the packaging substrate units, to form up-down paired packaging structure blocks having the packaging substrate units, each of the semiconductor chips having an active surface with a plurality of electrode pads installed thereon and electrically connected through solder bumps to the metal bumps; forming on the insulating protection layer and the semiconductor chips a packaging material, and filling a space between the semiconductor chips and the insulating protection layer with the packaging material to encapsulate the solder bumps; separating the packaging structure blocks, to form two independent packaging substrate blocks; and cutting the independent packaging structure blocks into a plurality of packaging structure units.

In the aforesaid method of fabricating a packaging structure, the panel of up-down paired packaging substrate is fabricated by the follow steps of: providing a carrier board having two surfaces; forming an adhesion layer on each of the surfaces of the carrier board; forming on each of the adhesion layer separation layers arranged in an array and surrounded by the adhesion layer; forming a metal layer on each of the separation layers and each of the adhesion layers; forming on each of the metal layers a plurality of conductive pads and a built-up structure sequentially, the built-up structure having at least a dielectric layer, a wiring layer formed on the dielectric layer, and a plurality of conductive vias formed in the dielectric layer and connecting the wiring layer and the conductive pads, a wiring layer on an outermost layer of the built-up structure having a plurality of bump pads; forming the insulating protection layer on the outermost layer of the built-up structure, the insulating protection layer having the openings formed therein to allow the bump pads to be exposed from the openings; and electroplating the bump pads to form the metal bumps.

In the aforesaid method, the up-down paired packaging substrate blocks are fabricated by cutting the panel of up-down paired packaging substrate along an edge of the separation layer, with a cutting edge not passing the separation layer.

In the aforesaid method, the independent packaging structure blocks are fabricated by the following steps of: cutting the up-down paired packaging structure blocks along an edge of the packaging structure blocks, with a cutting edge passing the separation layer; removing the carrier board, the adhesion layer and the separation layer, to separate the up-down paired packaging structure blocks into the two independent packaging structure blocks; and removing the metal layer.

The aforesaid method, after the metal layer is removed, further includes forming solder pads on each of the conductive pads.

The aforesaid method further includes forming a first surface treatment layer on each of the metal bumps, and the first surface treatment layer comprises Ni/Au, electroless Nickel/electroless Palladium/immersion Gold (ENEPIG), Sn, Ag, or Au.

In conclusion, the method of fabricating a packaging structure according to the present invention first cuts a panel of up-down paired packaging substrate into a plurality of up-down paired packaging substrate blocks, each of the up-down paired packaging substrate block having a moderate area and including a plurality of up-down paired packaging substrate units; the method then installs a semiconductor chip on each of the packaging substrate units, and uses a packaging material to fix and protect the semiconductor chip; and the method cuts the packaging substrate block into a plurality of packaging structure units. Compared with the prior art, the method of fabricating a packaging structure of the present invention integrates a packaging substrate fabricating process with a semiconductor chip packaging process, to package the semiconductor chips in the whole packaging substrate units in each of the packaging substrate blocks at one time, so as to simplify the fabricating process and increase the yield. Moreover, during the fabricating process of the present invention a carrier board is employed, such that a packaging process for a super thin packaging substrate may be used. Further, the packaging substrate block of the present invention has a moderate area, so each of the packaging substrate units in the packaging substrate blocks not only has higher precision and better yield, but also may save the layout cost and operation time and improve production.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Figure 1A:
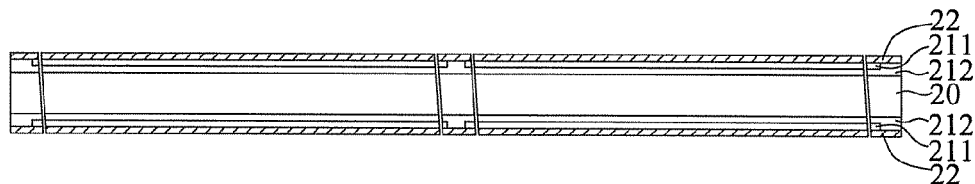
FIGS. 1A-1J are cross sectional schematic diagrams of a method of fabricating a packaging structure according to the present invention, wherein FIG. 1A' is a top view of FIG. 1A, and FIG. 1C' is a top view of FIG. 1C.
Figure 1A:
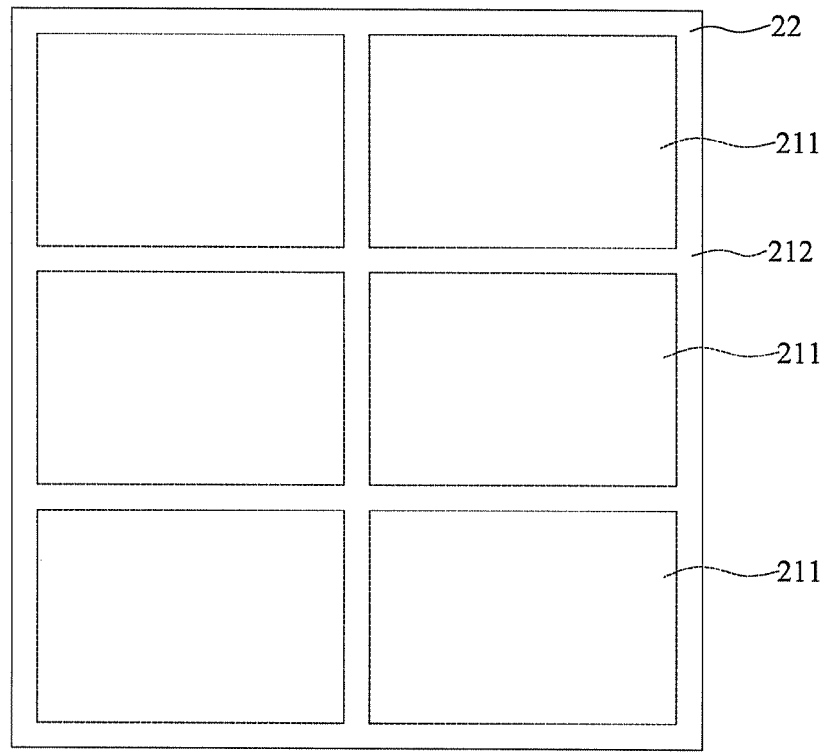
Figure 1B:
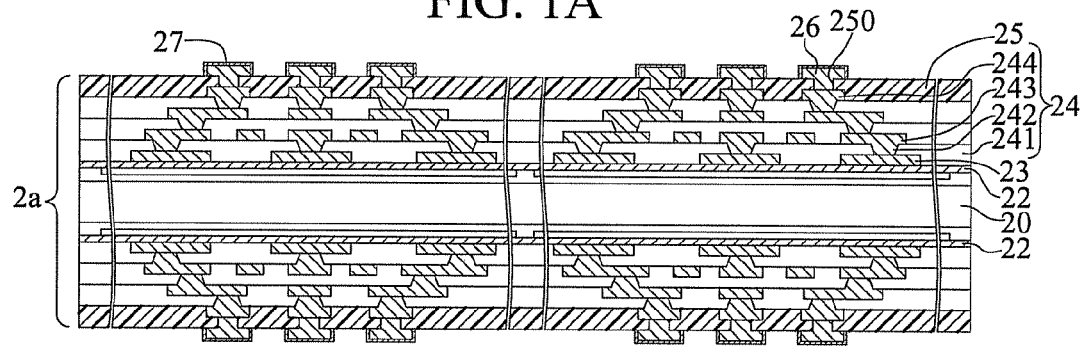
Figure 1C:
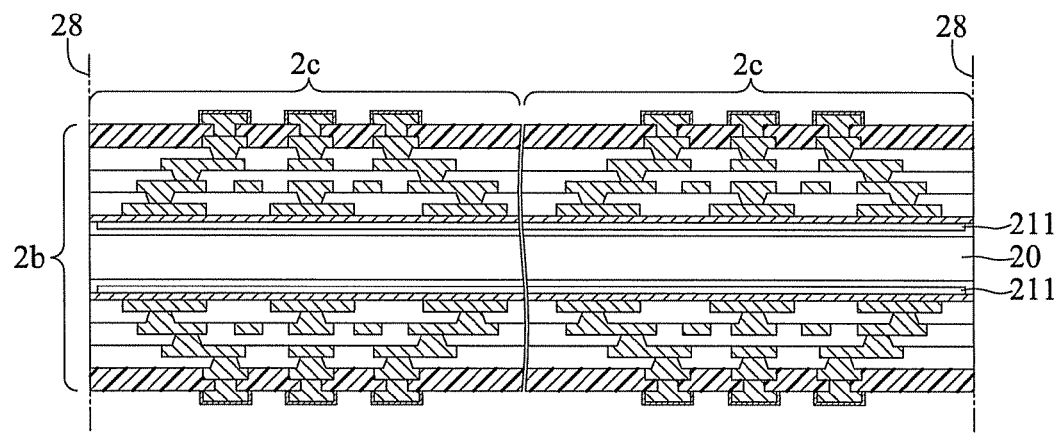
Figure 1C:
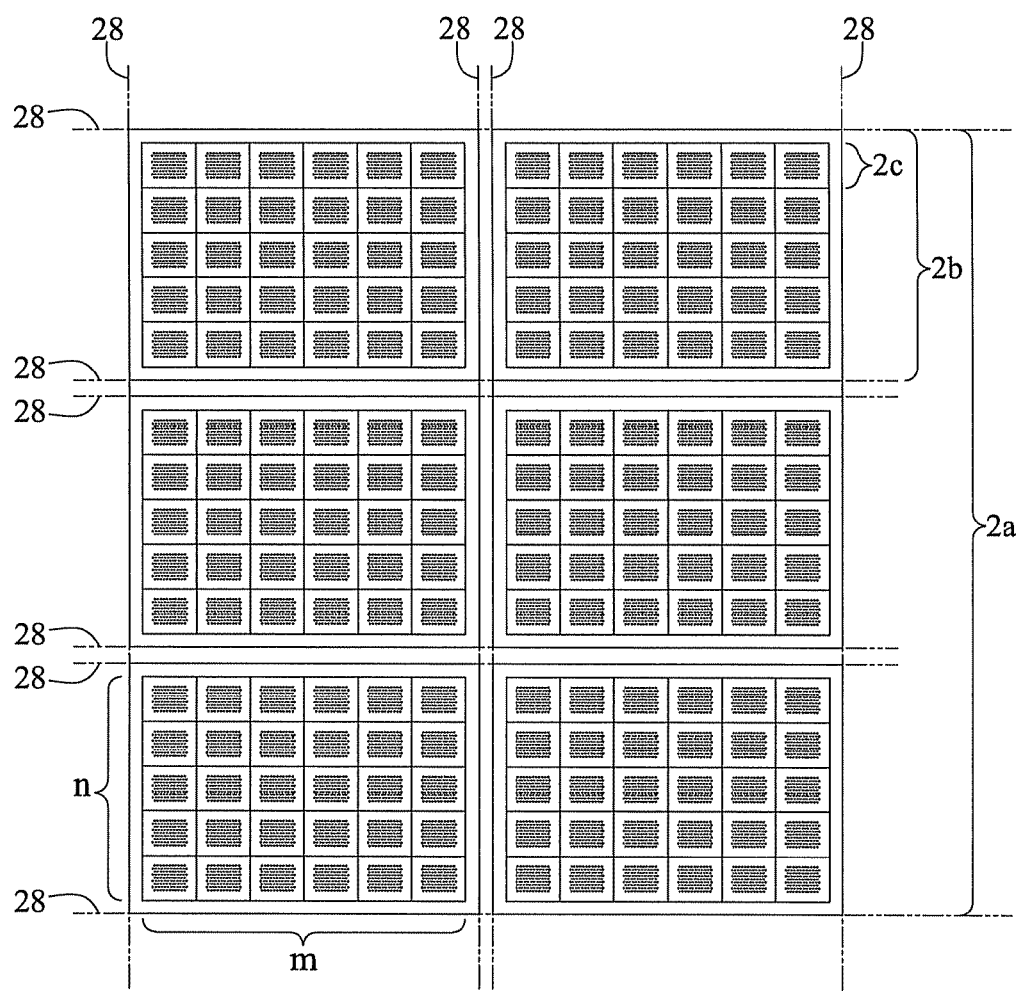

Please refer to FIGS. 1A-1J, which are cross sectional schematic diagrams of a method of fabricating a packaging structure according to the present invention, wherein FIG. 1A' is a top view of FIG. 1A, and FIG. 1C' is a top view of FIG. 1C.

As shown in FIGS. 1A and 1A', a carrier board 20 having two surfaces is provided, and two adhesion layers 212 are formed on the two surfaces of the carrier board 20, respectively; a plurality of separation layers 211 arranged in an array are installed on each of the adhesion layer 212, and are surrounded by the adhesion layer 212; a metal layer 22 is formed on the separation layer 211 and the adhesion layer 212, wherein the separation layer 211 may be a release film, the metal layer 22 may comprise copper, and the metal layer 22 may act as a seed layer of a current conduction route in an electroplating process.

As shown in FIG. 1B, a plurality of conductive pads 23 and a built-up structure 24 are formed sequentially on each of the metal layer 22. The built-up structure 24 comprises at least one dielectric layer 241, a wiring layer 243 formed on the dielectric layer 241, and a plurality of conductive vias 242 formed in the dielectric layer 241 and electrically connecting the wiring layer 243 and the conductive pads 23. The dielectric layer 241 comprises ABF (Ajinomoto Build-up Film), BCB (Benzocyclo-buthene), LCP (Liquid Crystal Polymer), PI (Poly-imide), PPE (Poly(phenylene ether)), PTFE (Poly (tetra-fluoroethylene)), FR4, FR5, BT (Bismaleimide Triazine), Aramide, or glass fiber. The wiring layer 243 on an outermost layer of the built-up structure 24 further has a plurality of bump pads 244. An insulating protection layer 25 is formed on the outermost layer of the built-up structure 24. A plurality of openings 250 are formed in the insulating protection layer 25, to allow the bump pads 244 to be exposed from the corresponding openings 250. Metal bumps 26 are electroplated on the bump pads 244. A first surface treatment layer 27 is formed on the metal bumps 26. Therefore, a panel of up-down paired packaging substrate 2a is formed. The first surface treatment layer 27 may comprise Ni/Au, electroless Nickel/electroless Palladium/immersion Gold (ENEPIG), Sn, Ag, or Au.

As shown in FIGS. 1C and 1C', the panel of up-down paired packaging substrate 2a is cut along an edge of each of the separation layers 211, and a cutting edge 28 does not pass the separate layer 211, so as to form a plurality of up-down paired packaging substrate blocks 2b, each of which comprises M×N up-down paired packaging substrate units 2c arranged in an array. Both M and N are an integer greater than one. In the embodiment, M is six, and N is five. Before the packaging substrate 2a is cut, a first protection film (not shown) is formed on the insulating protection layer 25 and the metal bumps 26 (or the first surface treatment layer 27), to prevent the insulating protection layer 25 and the metal bumps 26 (or the first surface treatment layer 27) from being affected by liquid or dust during the cutting process. The first protection film is removed after the cutting process.

Figure 1D:
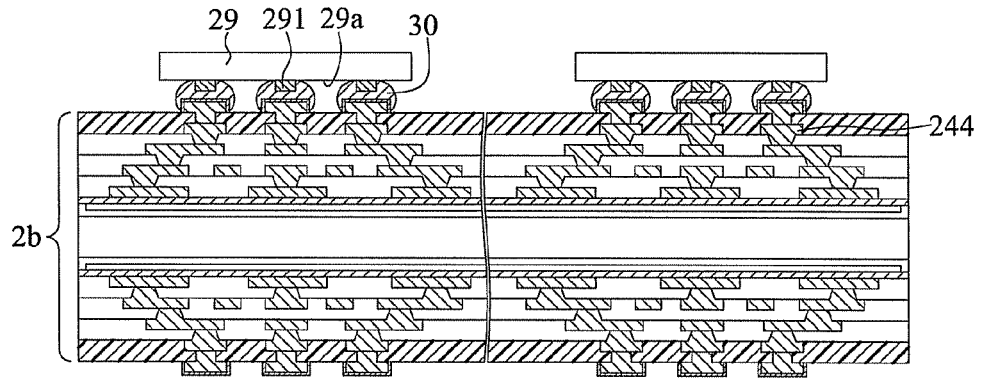
Figure 1E:
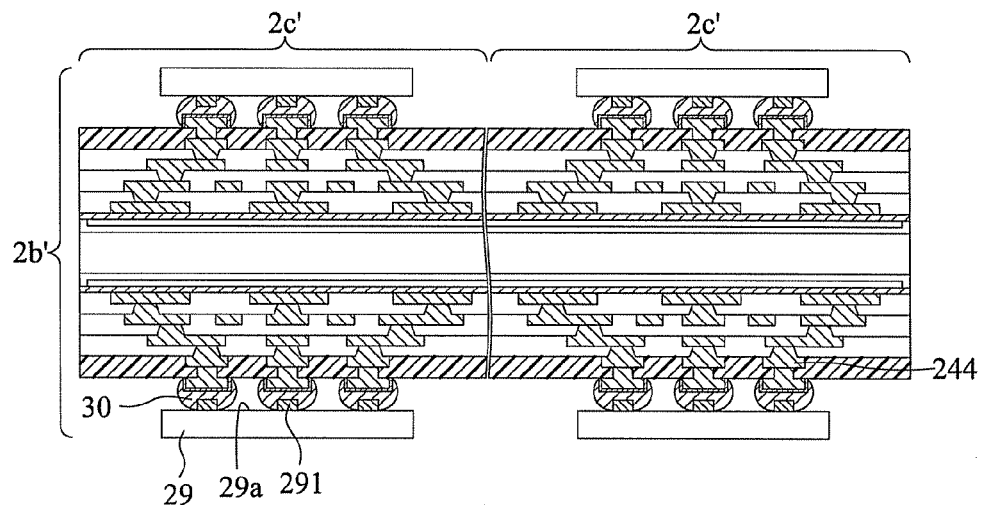

As shown in FIGS. 1D and 1E, a semiconductor chip 29 is installed on the metal bumps 26 of each of the up-down paired packaging substrate units 2c, to form up-down paired packaging structure blocks 2b' having a plurality of up-down paired packaging structure units 2c'. The semiconductor chip 29 has an active surface 29a. A plurality of electrode pads 291 are installed on the active surface 29a and are electrically connected via the solder bumps 30 to the metal bumps 26 correspondingly.

Figure 1F:
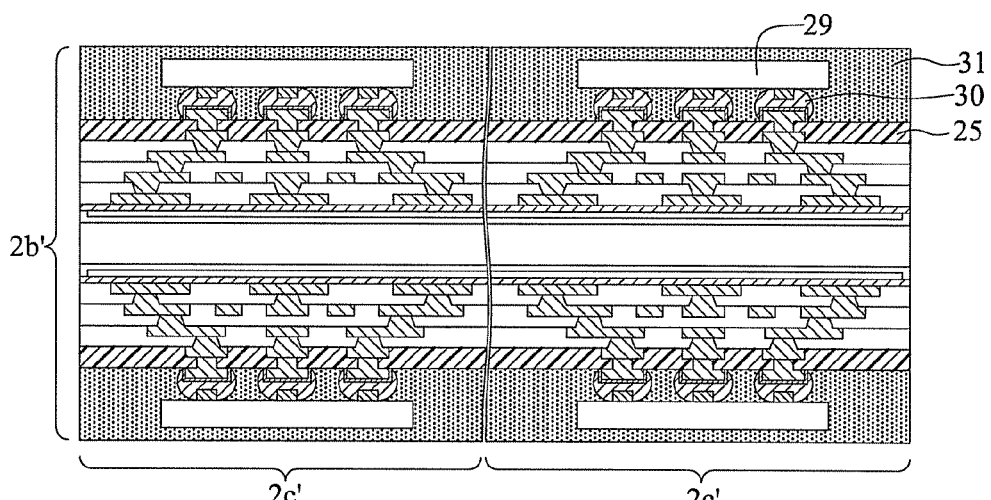

As shown in FIG. 1F, a packaging material 31 is formed on the insulating protection layer 25 and the semiconductor chips 29, and is filled into a space between the semiconductor chips 29 and the insulating protection layer 25 to encapsulate the solder bumps 30.

Figure 1G:
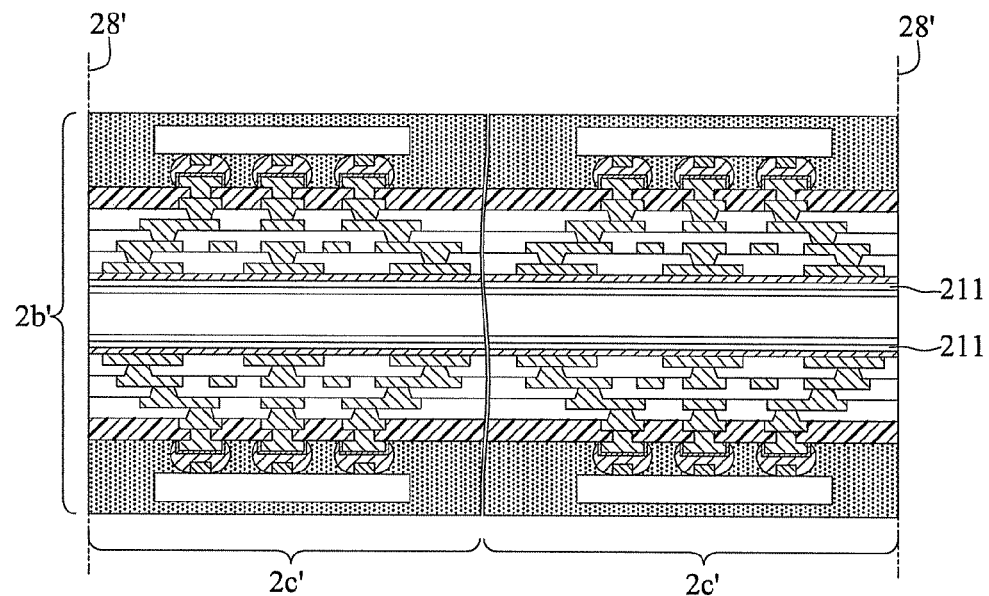

As shown in FIG. 1G, the up-down paired packaging structure blocks 2b' are cut along an edge thereof, and a cutting edge 28' passes the separation layer 211.

Figure 1H:
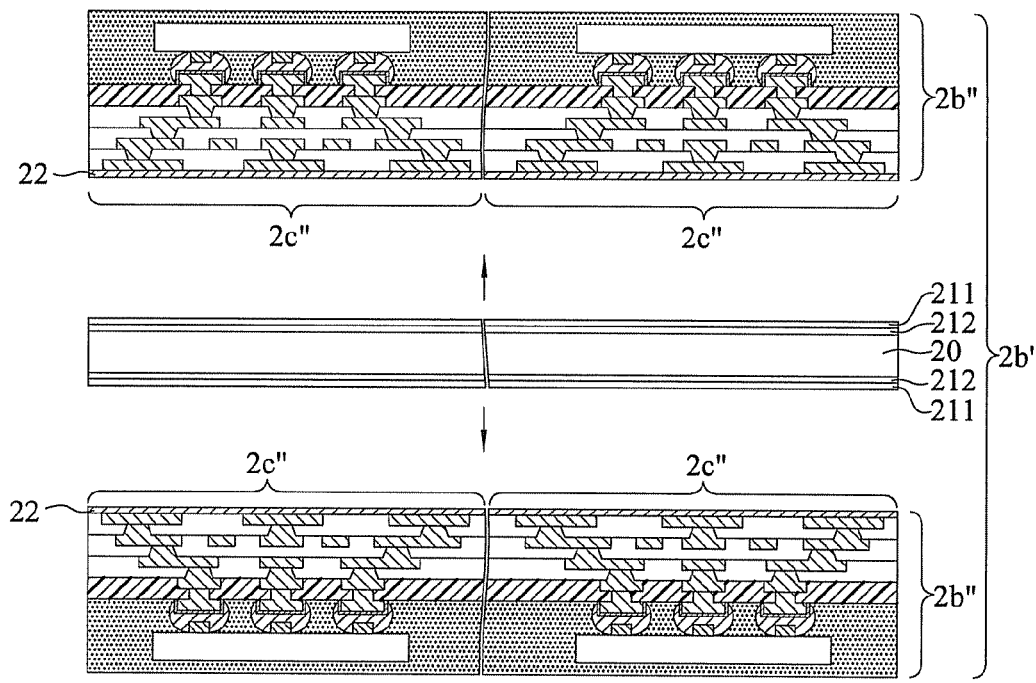

As shown in FIG. 1H, the carrier board 20, the adhesion layer 212 and the separation layer 211 are removed, so as to separate the up-down paired packaging structure block 2b' into two independent packaging structures 2b''. Each of the packaging structure blocks 2b'' has a plurality of packaging structure units 2c''.

Figure 1I:
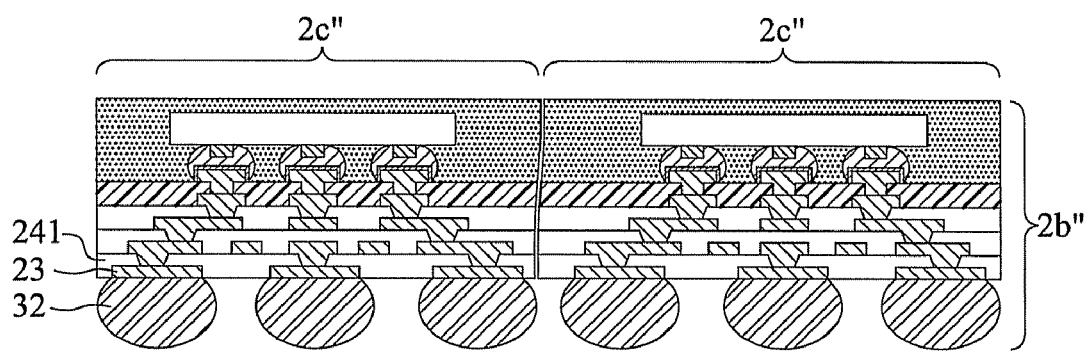

As shown in FIG. 1I. the metal layer 22 is removed, to expose the conductive pads 23. Solder balls 32 or a second surface treatment layer (not shown) are further formed on the conductive pads 23. The second surface treatment layer comprises Ni/Au, electroless Nickel/electroless Palladium/immersion Gold (ENEPIG), Sn, Ag, or Au.

Figure 1J:
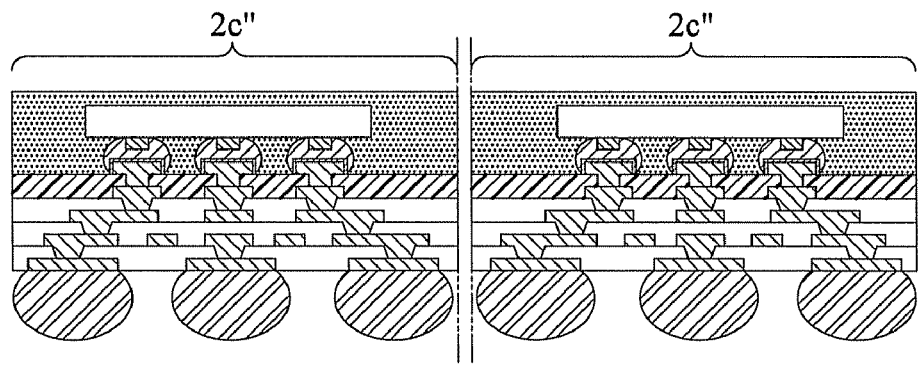

As shown in FIG. 1J, the packaging structure block 2b'' is cut into a plurality of packaging structure units 2c''. Before the packaging structure block 2b'' is cut, a second protection film (not shown) is formed on the conductive pads 23 (or on the solder balls 32 or the second surface treatment layer on the conductive pads 23) and the dielectric layer 241, to prevent the conductive pads 23 (or the solder balls 32 or the second surface treatment layer) and the dielectric layer 241 from being affected by liquid or dust during the cutting process. The second protection film is removed after the cutting process.

In conclusion, the method of fabricating a packaging structure according to the present invention first cuts a panel of up-down paired packaging substrate into a plurality of up-down paired packaging substrate blocks, each of the up-down paired packaging substrate blocks having a moderate area and including a plurality of up-down paired packaging substrate units; the method then installs a semiconductor chip on each of the packaging substrate units, and uses a packaging material to fix and protect the semiconductor chip; and the method cuts the packaging substrate block into a plurality of packaging structure units. Compared with the prior art, the method of fabricating a packaging structure of the present invention integrates a packaging substrate fabricating process with a semiconductor chip packaging process, to package the semiconductor chips in the whole packaging substrate units in each of the packaging substrate blocks at one time, so as to simplify the fabricating process and increase the yield. Moreover, during the fabricating process of the present invention a carrier board is employed, such that a packaging process for a super thin packaging substrate may be used. Further, the packaging substrate block of the present invention has a moderate area, so each of the packaging substrate units in the packaging substrate blocks not only has higher precision and better yield, but also may save the layout cost and operation time and improve production.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A method of fabricating a packaging structure, comprising:
   providing a panel of up-down paired packaging substrate, wherein two insulating protection layers having a plurality of openings are formed on two opposing outermost surfaces of the packaging substrate, respectively, and each of the openings has a metal bump installed therein;
   cutting the packaging substrate into a plurality of up-down paired packaging substrate blocks, each of the packaging substrate blocks having M×N up-down paired packaging substrate units arranged in an array, wherein the metal bumps are formed on the packaging substrate units, and both M and N are an integer greater than one;
   installing a semiconductor chip on the metal bumps of each of the packaging substrate units, to form up-down paired packaging structure blocks having the packaging substrate units, each of the semiconductor chips having an active surface with a plurality of electrode pads formed thereon and electrically connected through solder bumps to the metal bumps;
   forming on the insulating protection layer and the semiconductor chips a packaging material, and filling a space between the semiconductor chips and the insulating protection layer with the packaging material to encapsulate the solder bumps;
   separating the packaging structure blocks, to form two independent packaging substrate blocks; and
   cutting the independent packaging structure blocks into a plurality of packaging structure units.

2. The method of claim 1, wherein the panel of up-down paired packaging substrate is fabricated by the following steps of:
   providing a carrier board having two surfaces;
   forming an adhesion layer on each of the surfaces of the carrier board;
   forming, on each of the adhesion layer, separation layers arranged in an array and surrounded by the adhesion layer;
   forming a metal layer on each of the separation layers and each of the adhesion layers;
   forming on each of the metal layers a plurality of conductive pads and a built-up structure sequentially, the built-up structure having at least a dielectric layer, a wiring layer formed on the dielectric layer, and a plurality of conductive vias formed in the dielectric layer and connecting the wiring layer and the conductive pads, the wiring layer on an outermost layer of the built-up structure having a plurality of bump pads;
   forming the insulating protection layer on the outermost layer of the built-up structure, the insulating protection layer having the openings formed therein to allow the bump pads to be exposed from the openings; and
   electroplating the bump pads to form the metal bumps.

3. The method of claim 2, wherein the up-down paired packaging substrate blocks are fabricated by cutting the panel of up-down paired packaging substrate along an edge of the separation layer, with a cutting edge not passing the separation layer.

4. The method of claim 2, wherein the independent packaging structure blocks are fabricated by the following steps of:
   cutting the up-down paired packaging structure blocks along an edge of the packaging structure blocks, with a cutting edge passing the separation layer;
   removing the carrier board, the adhesion layer and the separation layer, to separate the up-down paired packaging structure blocks into the two independent packaging structure blocks; and
   removing the metal layer.

5. The method of claim 4, after the metal layer is removed, further comprising forming solder pads on each of the conductive pads.

6. The method of claim 1, further comprising forming a first surface treatment layer on each of the metal bumps.

7. The method of claim 6, wherein, the first surface treatment layer comprises Ni/Au, electroless Nickel/electroless Palladium/immersion Gold (ENEPIG), Sn, Ag, or Au.

* * * * *